United States Patent [19]

Laing et al.

[11] Patent Number: 5,445,177
[45] Date of Patent: Aug. 29, 1995

[54] PLATFORM FOR THE UTILIZATION OF SOLAR POWER

[76] Inventors: Johanes L. N. Laing; Inge Laing, both of 1253 La Jolla Rancho Rd., La Jolla, Calif. 92037

[21] Appl. No.: 781,250
[22] PCT Filed: Apr. 26, 1991
[86] PCT No.: PCT/EP91/00808
 § 371 Date: Mar. 5, 1992
 § 102(e) Date: Mar. 5, 1992
[87] PCT Pub. No.: WO91/17573
 PCT Pub. Date: Nov. 14, 1991

[30] Foreign Application Priority Data

Apr. 30, 1990 [DE] Germany .................. 40 13 843.7

[51] Int. Cl.6 ...................... H01L 31/052; F24J 2/00
[52] U.S. Cl. .................... 136/246; 136/248; 126/565; 126/567; 126/568; 126/698
[58] Field of Search .................... 136/246, 248; 126/565–568, 698–700, 705–708

[56] References Cited

U.S. PATENT DOCUMENTS

| | | | |
|---|---|---|---|
| 4,214,572 | 7/1980 | Gonder | 126/577 |
| 4,235,221 | 11/1980 | Murphy | 126/567 |
| 4,249,516 | 2/1981 | Stark | 126/601 |
| 4,289,112 | 9/1981 | Roseen | 126/568 |
| 4,350,143 | 9/1982 | Laing et al. | 126/568 |
| 4,771,764 | 9/1988 | Cluff | 126/577 |
| 4,786,795 | 11/1988 | Kurashima et al. | 250/203.4 |

FOREIGN PATENT DOCUMENTS

| | | | |
|---|---|---|---|
| 2407442 | 5/1979 | France | 126/568 |
| 2460400 | 1/1981 | France . | |
| 2471564 | 6/1981 | France . | |
| 3633172 | 4/1988 | Germany . | |
| 3934516 | 4/1991 | Germany . | |
| 3934517 | 4/1991 | Germany . | |

OTHER PUBLICATIONS

Japanese Patent Abstracts, vol. 8, No. 200 (E-266)(1637) Sep. 13, 1984, Kokai No. 59-89471 (May. 1984) Kikui.

*Primary Examiner*—Aaron Weisstuch

[57] ABSTRACT

The invention relates to a platform of the utilization of solar power which makes use of linear concentrators to beam the solar radiation for use in thermal, chemical or photovoltaic solar power converters, in which the azimuthal movement of the sun is followed by rotation about the main axis. The aim of the invention is to ensure an approximately uniform conversion rate of the solar radiation largely independently of the height of the sun while avoiding the use of a twin-axis follower system. The area available for utilizing the solar power is to be used as fully as possible as the aperture area to capture the radiation. According to the invention, a floating pipe (2, 2′, 112) forming a torus is fitted as a frame for a horizontally extending planar bearer (3-4) held, by substantially evenly distributed buoyant bodies (13, 36, 46, 64a, 64b, 80b) borne by a liquid, at a vertical distance from solar power converting devices (33, 53, 73, 73′, 93, 94b).

24 Claims, 11 Drawing Sheets

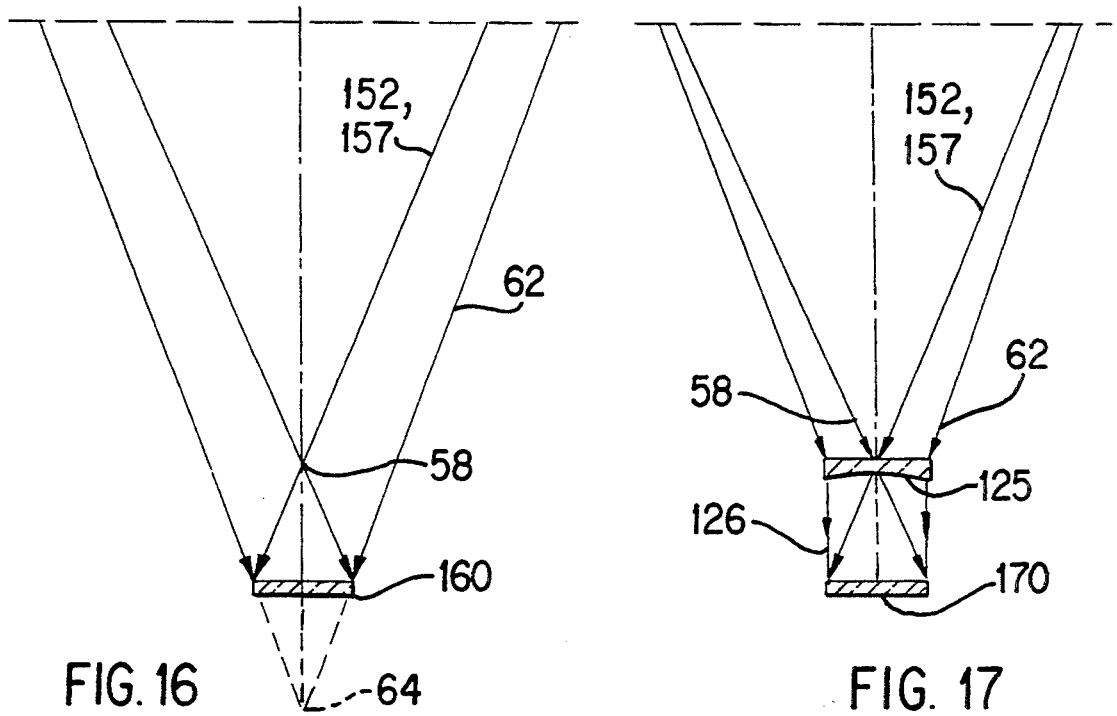
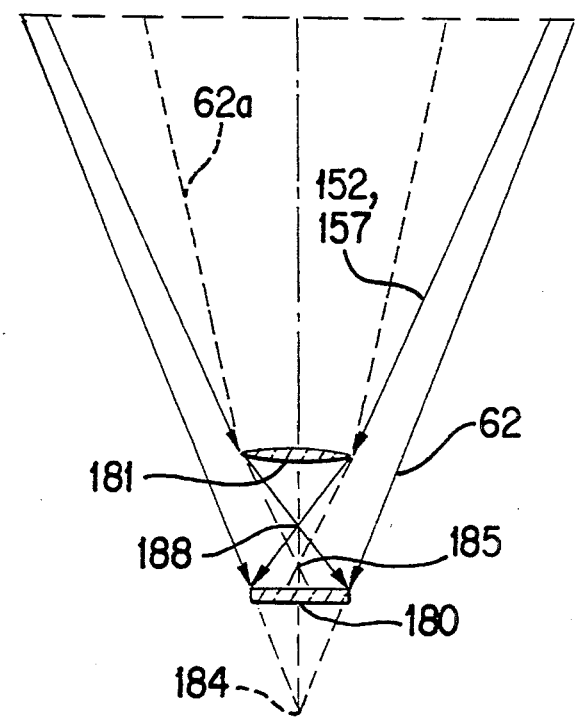

PLATFORM FOR THE UTILIZATION OF SOLAR POWER

TECHNICAL FIELD

The invention relates to a platform for the utilization of solar energy which concentrates the sun's rays by means of linear concentrators, so that the energy output can be used in thermal, chemical, or photovoltaic conversion systems.

PRIOR ART

Current technology involves mechanical tracking systems which tilt the concentrators in two planes, so that the normal on the converter plane with respect to the azimuth and the sun's elevation always points exactly to the sun. By reason of their complexity such technical solutions are only competitive with other electricity-producing systems in exceptional cases. In addition, the aperture surfaces of all tracking systems need large relative distances from each other to avoid mutual shading which results in lower area utilization. The costs are much lower if two-dimensional concentrating systems are installed on the north-south axis and are moved once per day around this axis. Also costs are lower if concentrators which are installed parallel to the diameter of a platform follow the azimuth of the sun by revolving the platform around its vertical axis. The disadvantage of this arrangement is that the daily yield is low because the radiation will irradiate almost perpendicular only twice per day.

The aim of the invention is to ensure an approximately uniform solar conversion which is largely independent of the sun elevation. This is accomplished by avoiding two-axis tracking systems and the use of a given surface almost totally as the aperture surface to capture the radiation.

SUMMARY OF THE INVENTION

The invention solves the problem of utilization of solar energy by use of a platform which is revolved around its vertical axis by mechanical means at a velocity coinciding with the azimuthal movement of the sun. An annular tube forms a frame for a planar support extending horizontally and which is held by buoyant bodies floating on a liquid.

It is advantageous that the metal strips which form the planar support are pointing directly to the sun.

The planar support carries optically-transparent, radiation-refracting roof elements.

The radiation-refracting roof elements are echelon lenses which can be cylindrical fresnel lenses, the axis of which lies in a vertical plane pointing to the sun. Thus the sun's rays are directed to an energy converter arranged parallel to and close to the focal line of the echelon lenses. These lenses have flanks which face the sun such that the sun's rays are refracted towards the vertical plane onto the solar energy converting devices.

The radiation-refracting roof elements can be designed as a panel containing echelon lenses on one side and fresnel lenses on the other side, whereby the flanks of the echelon lenses face the sun and run perpendicular to the focal line of the fresnel lens.

The radiation-refracting roof panels can also have a smooth upper surface and a lower surface facing the solar energy converting device which is broken down into rectangular facets. The rectangular facets have flanks facing the sun as well as flanks running perpendicular to the first set of flanks and fulfilling the fresnel lens requirement. Thus the facets are inclined relative to the upper surface in two planes running perpendicular to each other. The angles of inclination are such that on the one hand the sun's rays are directed onto a focal line lying in a vertical plane pointing to the sun and at the same time the sun's rays are refracted toward the normal on the focal line.

The cross-section of the roof element is convex, facilitating drainage of rain water. These elements can have a hydrophilic surface coating.

Between the roof elements and the energy converting device is an optical system which twice per day refracts the sun's rays onto a vertical plane running perpendicular to the focal line. Solar rays impinging at a low angle will be bent to the vertical plane at an angle which is equal to the angle which the refracted solar rays near the zenith form with the vertical plane.

The optical system can also contain a translucent panel having wedges on the side facing the planar support as well as on the side facing the energy converter.

The optical system can also consist of at least two echelon lenses.

In the case of two panels the wedges of the upper panel are offset from those of the lower panel in the horizontal direction, and the flanks facing the sun should form such an angle with the vertical that the impinging solar rays exit the echelon lens within the same angular range as the sun's rays passing between the flanks.

Adjustment of the focal lines associated with the different imaging lengths is achieved by placing the energy converter at half the distance to the focal line for perpendicular angle of incidence and that of the focal line of the lowest angle of incidence. Alternatively, a diverging cylindrical lens can be placed at the level of the focal line for the wedge of rays close to the horizon or the wedge of rays close to the zenith, the width of the lens having the same width as the wedge of rays which run perpendicularly.

Such an adjustment can also be achieved by having the rays with low angle of incidence and the rays close to the zenith pass through a convex cylindrical lens, which concentrates the rays emerging from the lens onto a focal line which is situated between the energy converter and the convex cylindrical lens. In this case the energy converter is placed above the focal line of the vertically impinging rays.

In addition, concentrating mirrored strips can be arranged along the longitudinal edges of the energy converter. The upper edges of the strips which point to the optical system are separated more widely from each other than the width of the energy converter. The curvature of these collecting strips is formed such that the rays with low angle of incidence and the rays close to the zenith are reflected onto the energy converter while the vertical inner rays impinge directly on the energy converter.

A different arrangement can consist of mirrored troughs running parallel to the diameter, and aligned toward the sun and carried by floating tubes.

By placing a deflecting element in the focal zone, the beams can be concentrated onto a photovoltaic cell.

A further variant uses a continuous membrane which is placed on the liquid layer covering it completely. The solar energy converting elements are placed on this membrane together with struts which hold the horizontal support and the cooling tubes.

To prevent wastage of sun rays, blackened tubes are placed on both sides of the energy converter. These tubes are closed on both ends and filled with a medium which will expand under heat if stray concentrated rays impinge.

The energy converter has to be in good contact with a coolant which will flow through a pipe forming a unit with the energy converter.

The waste heat can be absorbed by the water of the liquid layer. It can also be transferred into a heat exchanger cycle. This heat exchanger can be a thermodynamic machine, a sea water desalination plant, or a biological production stage to supply an algae breeder with heat. The cooling water can be fed via an open trough running along the periphery of the platform through a distributing system into the energy converting devices.

BRIEF DESCRIPTION OF THE DRAWINGS

The invention shall be described in conjunction with the following figures, wherein

FIG. 4b is a vertical section B—B according to FIG. 4a.

FIG. 4c shows a section C—C according to FIG. 4a.

FIG. 8b shows an enlarged section of a solar energy converting device as in FIG. 8a.

FIG. 16 shows the arrangement of the energy converter relative to focal lines of two wedges of rays.

FIG. 17 shows the arrangement of the energy converter relative to two focal lines with interposed dispersing cylindrical lens.

FIG. 18 shows the arrangement of the energy converter relative to two focal lines with interposed converging lenses.

DETAILED DESCRIPTION OF THE INVENTION

Figure 1:
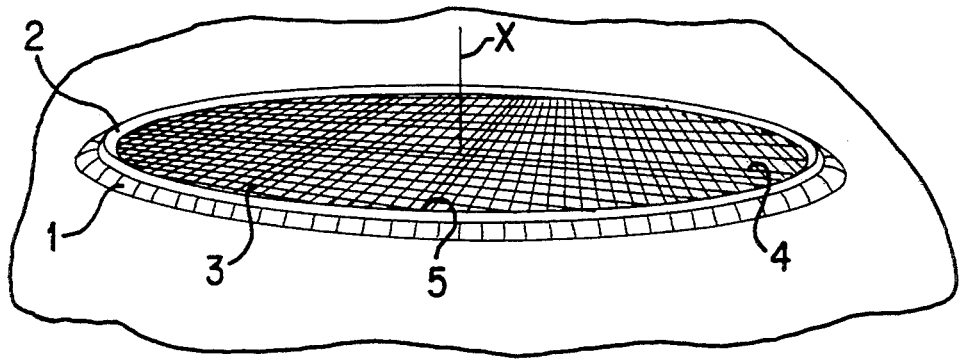
FIG. 1 shows a rotatably arranged platform.
Figure 2:
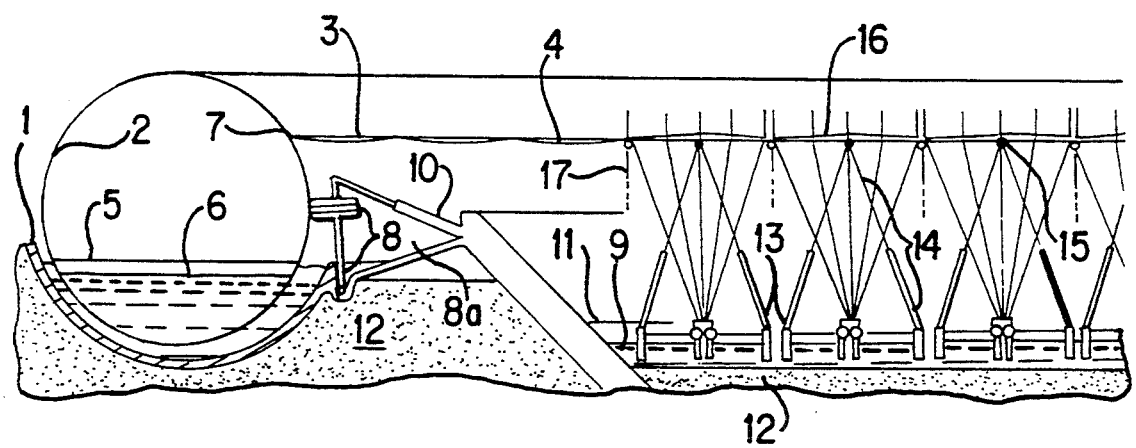
FIG. 2 is a cross section through one part of the platform.

The layout of the platform according to the invention is shown in FIGS. 1 and 2 and consists of a water filled concrete trough 1, in which a frame 2, formed by an annular steel pipe, floats. Ropes 3 and 4 running perpendicular to each other are suspended by frame 2. The spaces between internal walls 5 contain ballast water. The steel ropes 3 and 4 are fastened to shackles 7. Frame 2 is centered by automotive type rollers 8, some of which are driven by synchronous motors. This causes a rotation of frame 2 with the steel ropes 3 and 4 attached to it around its vertical axis x. The angular velocity is chosen so that the ropes 4 always run parallel to the rays from the sun. The axles of rollers 8 can be tilted around a fulcrum 8a and are pressed by spring elements 10 against the side of frame 2 which faces the vertical axis x. The circular area surrounded by trough 1 is covered by a film 11 separating the water layer 9 from the smoothed subsoil 12. The rim of the film 11 is raised so that a basin for the water layer 9 is built in which the pontoons 13 can float. Pontoons 13 are connected with struts 14 by sleeves 15 through which one of the steel ropes 4 runs. This enables the pontoon 13 to tilt around the steel rope 4. The grid 3-4 formed by the traversing steel ropes 3 and 4 is held in a horizontal position by the struts 14 which are supported by the floating pontoons 13. The grid 3-4 serves as support for the roof elements 16 which are composed of cylindrical lenses above each pontoon 13. Echelon lenses are built as fresnel lenses. The roof elements 16 are slightly inclined to each other so that water can flow off through the drains 17 arranged between the roof elements 16.

Figure 3:
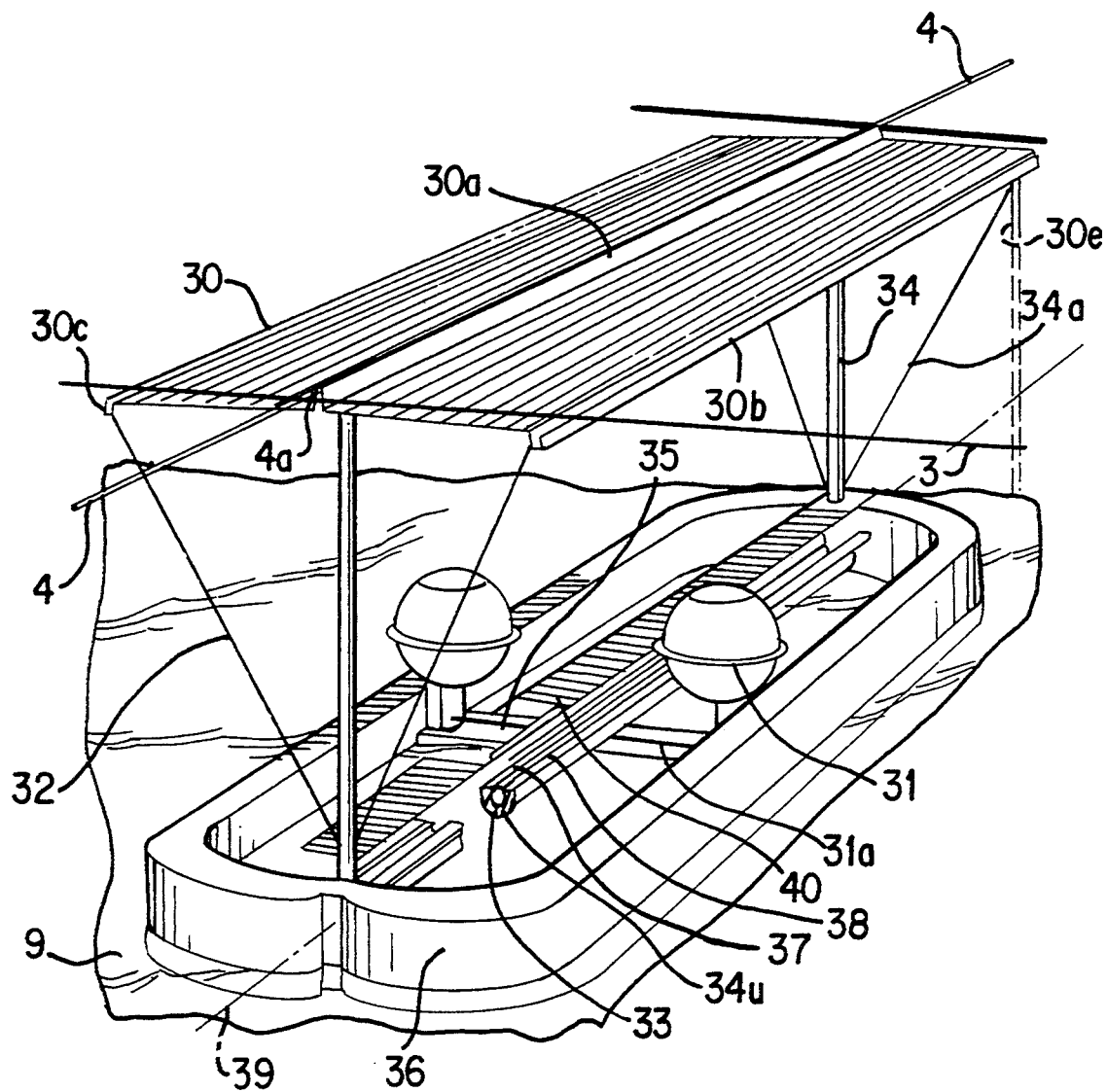
FIG. 3 is a perspective drawing of a modular energy conversion unit.

Instead of the connection of the pontoons to the roof elements arranged above as shown in FIG. 2, the invention provides also for modular energy conversion units as shown in FIG. 3. These consist of a frame 36 in the form of a chain link, formed by hollow plastic bodies connected to each other. The lower part of the frame 36 is submerged in water layer 9. Flat metal struts 34 and cables 34a connect frame 36 with the corresponding roof element 30, which forms an echelon lens acting as a fresnel lens. The optically transparent roof element 30 which concentrates the solar radiation onto focal line 39 consists of two roof halves which are formed into fins 30a between them, supported by steel rope 4. At the crossing point steel ropes 3 and 4 are connected. The grid 3-4 thus formed serves both as guiding and positioning element for each energy converting unit, and therefore is partially supported by each of the modules and kept in a horizontal position. One of the edges of roof elements 30 running parallel to steel rope 4 has a gutter 30b, the opposite edge has a flanged area 30c so that adjacent roof elements can interlock. In order to drain off water the two halves of roof element 30 have a slight inclination to each other. Rain water as well as water from water layer 9 used for cleaning of the outer areas can be collected in gutter 30b and drained via hose 30e, which reaches below the water surface of water layer 9.

In the vicinity and parallel to focal line 39 a photovoltaic cell acts as energy converter forming a unit with a heat insulated pipe 34u. A heat carrier fluid which carries off the waste heat of the photovoltaic cell 33 circulates through pipe 34u. The waste heat can be piped to a thermal cogeneration stage (not shown). If there is no cogeneration, pipe 34u forms a heat pipe which transports the heat to be dissipated into water layer 9. In this case water layer 9 will experience a temperature rise during sunshine hours. The input of the waste heat will be reradiated by the water surface or if this is covered by a film as described in FIG. 8, by the film. This will result in a temperature increase of the transparent roof element 16, so that the heat will be dissipated by reradiation and convection. During the remaining hours the waste heat of water layer 9 will be extracted by evaporation. The evaporated part of the water will condense on the roof elements 16. These are coated with a hydrophilic layer so as to avoid the formation of condensation droplets which would interfere with the entrance of the direct radiation during daylight hours. The condensation of the water condensed on the roof elements 16 heats up these roof elements so that during the night the main part of the heat stored during the previous day can be dissipated.

Along the longitudinal sides of the photovoltaic cells 33 mirrored strips 37 are arranged so that the beams which were refracted due to surface inaccuracies are reflected onto the photovoltaic cell 33. Along the upper edges of these mirrored strips 37 evaporation tubes 37a are mounted. These tubes contain a low boiling point liquid and, at a short distance above, oblong prisms 38 are arranged, the function of which is described in FIG. 19. Above these prisms 38 a system of echelon lenses 40b is arranged within the wedge of rays concentrated by the fresnel lenses. These deflect the wedge of rays almost independent of the angle of incidence of the sun, and almost perpendicular within a limited angular sector onto the photovoltaic cell 33.

If possible, the photovoltaic cell 33 should be exposed to the whole cross section of the concentrated wedge of rays. If this is not the case, analogous to the devices described in FIG. 5 and 7, a part of the wedge of rays will impinge on one of the two evaporator tubes 37a, the surface of which is blackened, and cause evaporation of the low boiling liquid. The vapor passes through a pipe (not shown) into the thermally insulated upper part of a ball-shaped container 31. This is situated on the same side as the evaporator tube 37a. A horizontal film separates the ball into a lower water compartment and an upper vapor compartment. The water compartment is filled with ballast water. Excess pressure within the vapor compartment causes a part of the ballast water to flow via a connection pipe 31a into a second container 32 on the other side of the pontoon. By this change in the center of gravity, pontoon 13 tilts around steel rope 4 until the wedge of rays again impinges totally onto the photovoltaic cell 33. A spring loaded gate valve prevents back flow of the ballast water as long as no excess pressure acts on the water content of the heavier container 32. Cables 34a are necessary in order for the roof element 30 to tilt. As an alternative analogous to the arrangement in FIG. 6 the roof element can also be built from strips which extend over a number of pontoons 13 arranged under rope 4. In this case the cables 34a are not necessary.

Figure 4A:
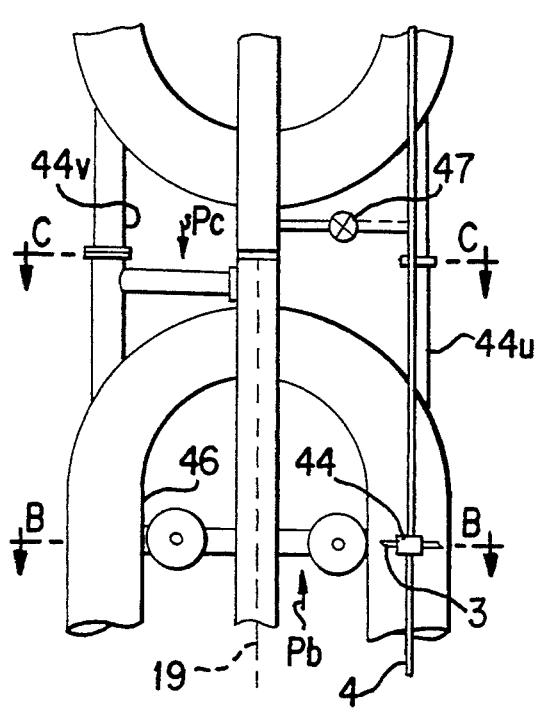
FIG. 4a shows a top view of the connection of two modules.
Figure 4B:
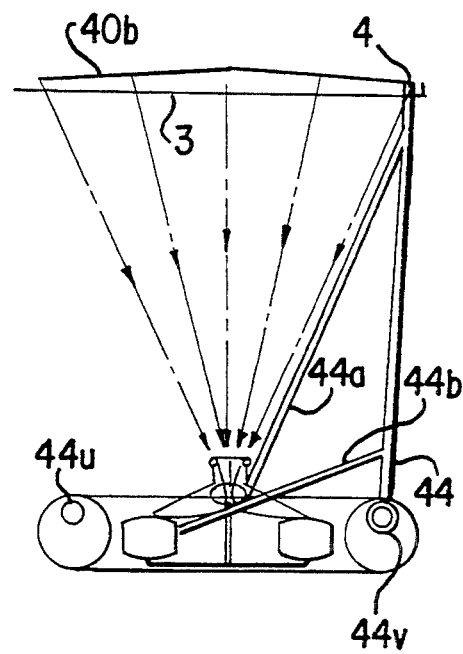
Figure 4C:
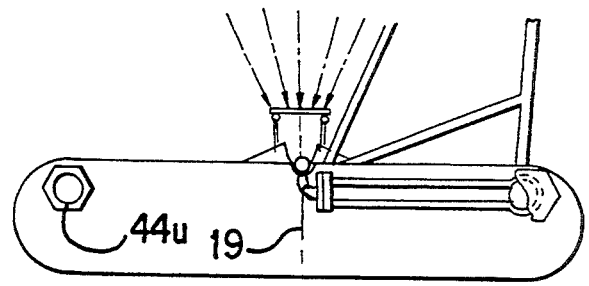

An alternative arrangement of the pontoons as shown in FIG. 4a, 4b and 4c contains a frame 46 consisting of a rigid tube in the shape of a chain link preferably made out of polyolefin, which supports the steel ropes 3 and 4 by struts 44. Strut 44 is secured against flexing around an axis parallel to the focal line 19 by struts 44a and 44b and by cables against flexing around an axis perpendicular to the focal line 19. In contrast to the arrangement of the struts 34 in FIG. 3, strut 44 mounted on one side of frame 46 does not obstruct the path of the rays. To compensate for weight of the roof elements 40, which stretch over many pontoons, and of the steel ropes 3 and 4, the diameter of the side of the frame which supports strut 40 is slightly larger than the one on the opposite side.

Figure 5:
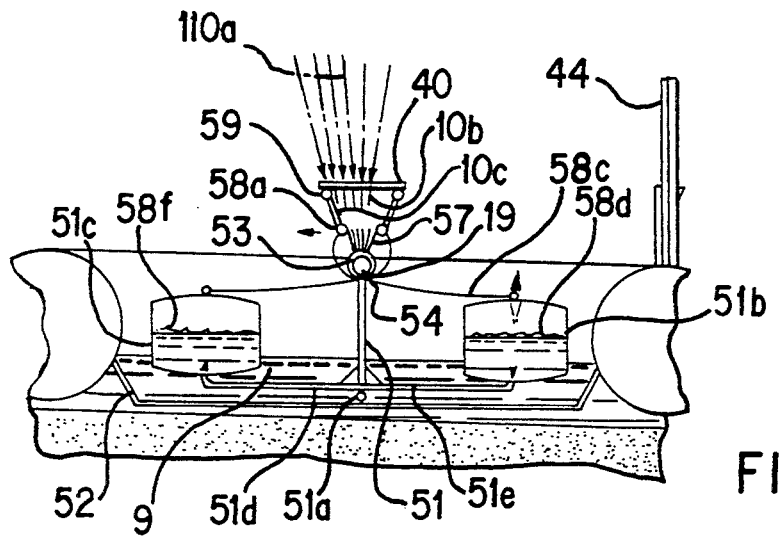
FIG. 5 is an enlarged view of a section according to FIG. 4b.

The alternative arrangement of the pontoon has an oblong solar energy converting device as described in FIG. 5. The easily detachable device is connected to a tube 44u for the heat carrier fluid and an insulated return pipe 44v. The pipes for the heat carrier fluid 44u and 44v run within the sides of frame 46. The temperature of the cooling water leaving the device can be adjusted by throttling the flow velocity within the cooling pipe 54 of the photovoltaic cell 53.

The dimension of frame 46 should be such that it permits transportation by ordinary means.

In the solar energy converting device of FIG. 5 as it is used in the pontoon arrangement of FIG. 4 the photovoltaic cell 53 forms a unit with cooling water pipe 54. Adjacent to the photovoltaic cell 53 mirrored strips 57 are arranged. Their function is described in FIG. 20. Along the upper edges of these mirrors 57 run blackened evaporating tubes 58a and 58b. The function of the echelon lens system 40 which also has refracting oblong prisms 59 in its fringe area is described in FIGS. 12 to 14. The effect of the oblong prisms 59 is described in FIG. 19. These elements are combined into rod-shaped units of several meters length. Via a hinged traverse 51 these units are supported on a bridge 52. The traverse 51 which can swing around the fulcrum 51a in addition supports two displacement floats 51b and 51c. These are analogous to the ball shaped containers 31 and 32 in FIG. 3 segmented by horizontal films into an upper vapor compartment and a lower water compartment. The water compartments communicate with each other via a pipe 51a in which a spring loaded gate valve 51e is incorporated. The sun's rays which are concentrated by roof 40 (see FIG. 4) onto the focal line 19 pass through the flat lens system 40 as rays 110a and impinge almost perpendicularly as rays 10b on the photovoltaic cell 53. If the rays 10b drift out of range of the mirrored strip 57 these rays 10c heat up the evaporation tube 58a. The resulting vapor will be conducted via pipe 58a into the displacement float 51b and displace film 58d, whereby a part of the ballast water is conveyed via pipe 51d into the lower water compartment of displacement float 51c. The displacement float 51c now submerges deeper into water body 9 whereby the whole unit swings around fulcrum 51a until the rays 10c move back into the area of the concentrating mirrored strips 57 and thus onto the photovoltaic cell 53. Reverse tilting is prevented by the spring loaded gate valve 51a until evaporation takes place within the evaporator pipe 58b on the opposite side.

Figure 6:
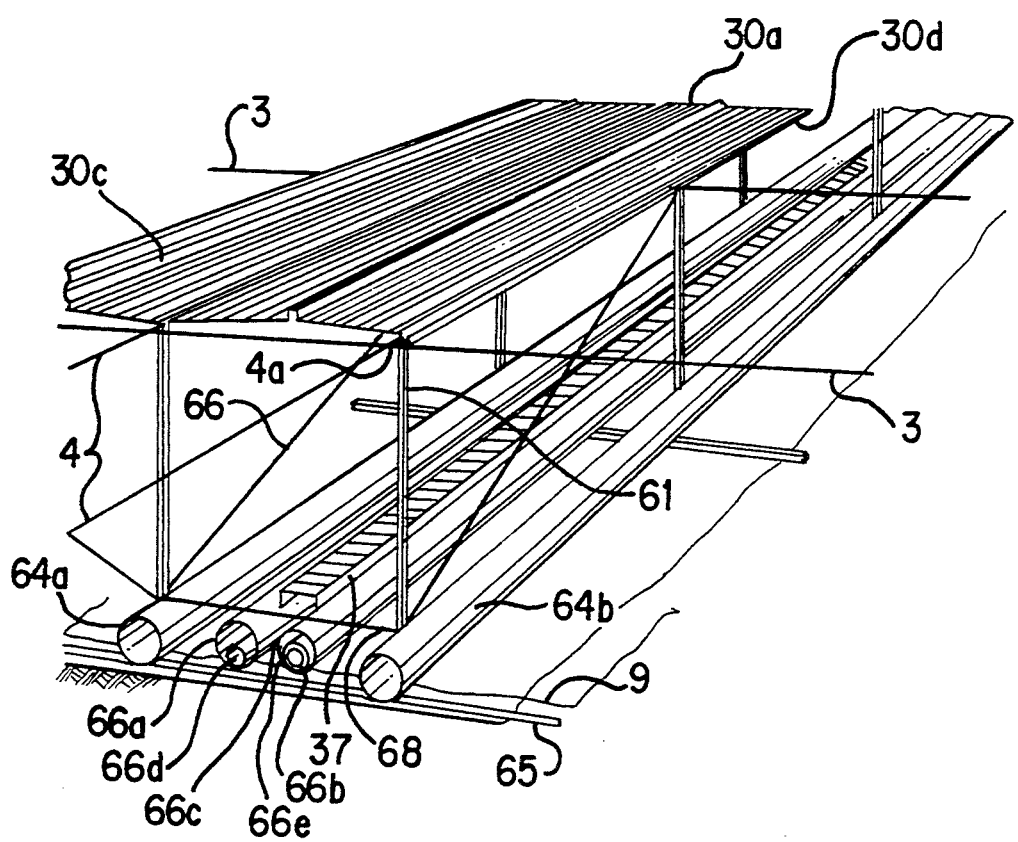
FIG. 6 shows an alternative design of an energy conversion unit.
Figure 7:
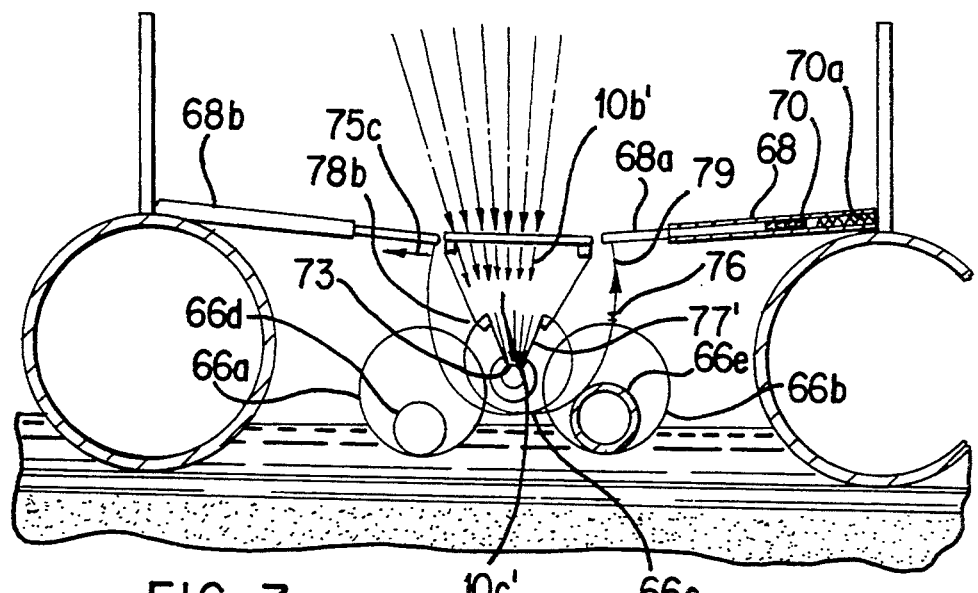
FIG. 7 is an enlarged view of a cross section of the energy conversion unit in FIG. 6.

The specific layout shown in FIG. 6 consisting of the floating bodies 64a and 64b is formed by pipes filled with compressed air which are held at a constant spacing by struts 65. Struts 65 support the steel grid 3-4 and the roof elements 30u by means of struts 61. Diagonal running tension cables 66 in a horizontal as well as in a vertical direction serve as mounting support for the exact positioning of steel grid 3-4 and the roof element 30u. Between the floating bodies 64a and 64b two additional floating bodies 66a and 66b, also filled with compressed air are connected to each other by a bridge 66c. They have a lesser depth of immersion into the water layer 9 than the roof supporting floating bodies 64a and 64b. The energy converting devices are placed in the space between the two floating bodies 66a and 66b which consist, according to FIG. 7, of a photovoltaic cell, a vacuum insulated cooling pipe arranged below the cell, mirrored strips with evaporation pipes, oblong prisms and an echelon lens system. The length of the unit is designed so that it can be exchanged easily for maintenance.

Tubes 66d and 66e of a cooling water system under pressure and vacuum insulated warm water pipe 66e for the return of the heated cooling water run within the floating bodies 66a and 66b. Each photovoltaic-optical unit is connected by a detachable hose coupling with the cooling water distributing pipe 66a and at the exit with the warm water pipe 66e (not shown). The floating units 66a and 66b are kept in their position relative to the floating bodies 64a and 64b which support the roof by telescopic tubes 68 as described in FIG. 7. Each telescopic tube 68 consists of two telescoping tubes 68a and 68b in which a bellows 70 and a helical spring 70a of smaller diameter are arranged. The bellows 70 is connected via tube 79 with the inside of a blackened hollow body 78a which runs along the mirrored strips 77'. The hollow body 78b and the bellows 70 are filled with a high thermal expansion coefficient liquid. If the stray rays 10c' of the wedge of rays 10b' drift away from the photovoltaic cell 73 and heat up the hollow body 78a, fluid will flow through tube 79 into the bellows 70 and will cause a linear expansion of the bellows. This results in a shifting of the floating bodies 66d and 66e together with the solar energy converting unit in the direction of the stray rays 10c'. This movement ends as soon as the total wedge of rays 10c impinges again on the photovoltaic cell 73. In order to prevent the back flow of the displaced water a spring loaded gate valve 76 is located in pipe 79 through which a back flow into hollow body 78b can only take place if the hollow body 78a is exposed to radiation.

Figure 8A:
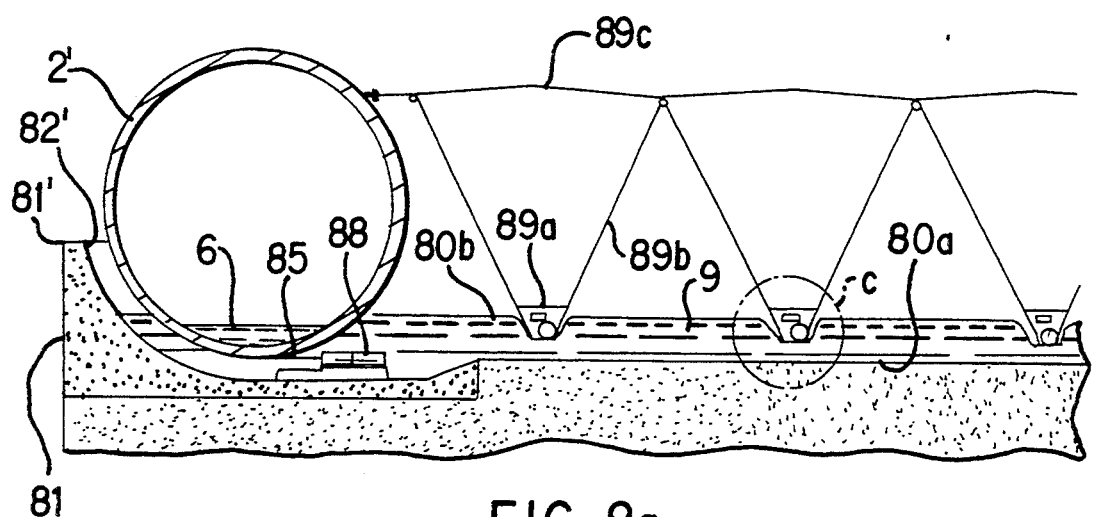
FIG. 8a shows a cross section through the rim portion with a buoyancy membrane.

In the version shown in FIG. 8a the soil 80 is enclosed by an L-shaped wall 81 and is sealed off by a film 80a. The pond thus formed is filled with water 9. Along the lower region of frame 2' a metal ring 85 is attached, which engages in rollers 88 movable in a radial direction. These rollers 88 center the annular frame 2'. Some of these rollers are driven by step motors (not shown).

A second film 80b which covers water layer 9 is attached to the annular frame 2'. The solar energy converting modules 89a are arranged parallel to each other. These support the roof elements 89c, designed as fresnel lenses, by means of struts 89b which depress the area of film 80b running below it to provide buoyancy. The devices 89a contain the same elements as described in FIG. 7. The circled area C is shown enlarged in FIG. 8b. A ring shaped film 82' which is in sliding contact with the upper rim of wall 81' and which is connected with the outer surface of frame 2' considerably reduces possible evaporation of water.

Figure 8B:
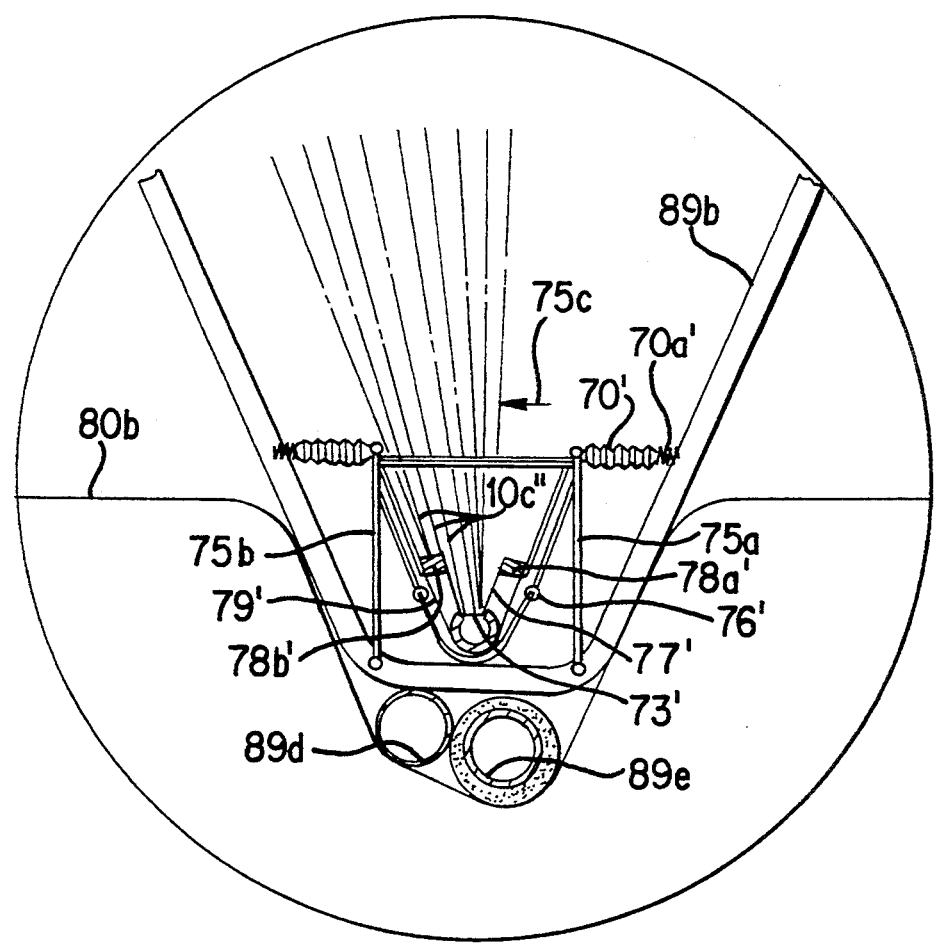

The V-shaped struts 89b shown enlarged in FIG. 8b lie on the cooling water pipes 89e and 89d and together with these pipes cause the trough-shaped indentation in film 80b which extends over the whole diameter pointing to the sun. The solar energy converting devices 89a correspond in all parts to those shown in FIG. 7. A pipe 79' which incorporates a spring loaded gate valve 76', connects tube 78b' with bellows 70' which via a helical spring 70a' is connected to strut 89b. If stray rays 10c'' which drifted out of range impinge on tube 78'a part of the enclosed liquid is forced into bellows 70' whereby the device 89a (which can tilt around toggle joints 75a and 75b) will be shifted in the direction of arrow 75c so that the stray rays 10c'' will return to the space between the mirrored strips 77'.

Figure 9:
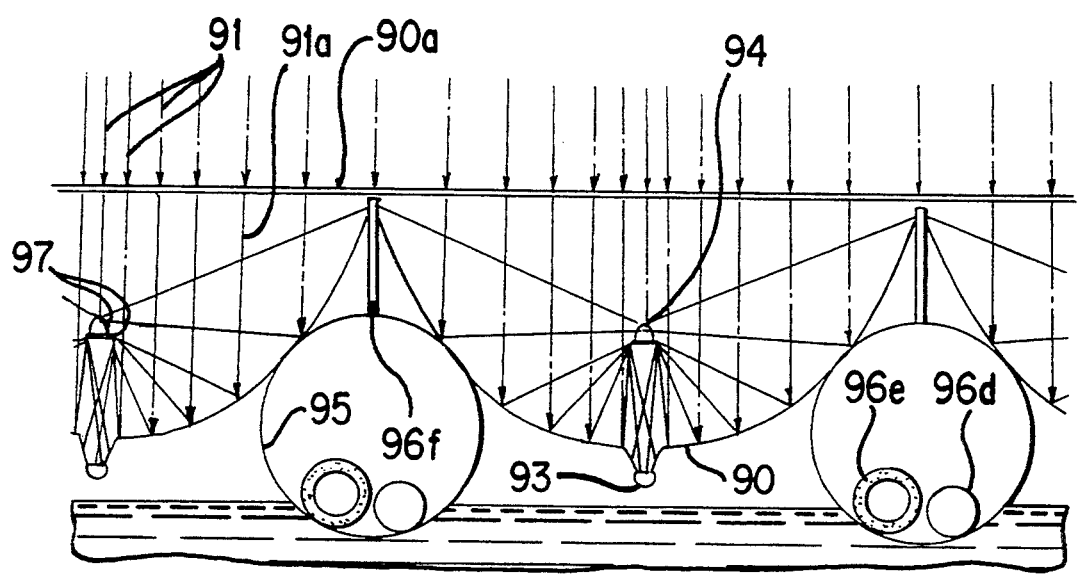
FIG. 9 is a further embodiment in which parabolic mirror troughs rest on floating tubes.

A further method using the azimuth tracking achieved by a platform rotating around its vertical axis is shown in FIG. 9. This alternative uses parabolic mirrored troughs 90 on which rays 91 impinge, which have been refracted in the vertical direction by an echelon lens 90a. Close to the focal area 97 of each of the mirrored troughs 90 and parallel thereto an optically deflecting element 94 is arranged which is described in FIG. 10. The shortening of the length of the emerging rays within the mirrored trough 90, caused by the refraction of the echelon lens 90a, reduces the widening of the focal line due to the unavoidable aberration. At the lower side of the optically deflecting element 94 a concentration of the rays is directed almost perpendicular onto a photovoltaic cell 93 arranged within the mirrored trough 90. The mirrored troughs 90 can extend over the whole length of the platform diameter. Also, short mirrored troughs may be used the longitudinal axes of which are tilted towards the sun. Between the mirrored troughs 90 are arranged tubular floating bodies 95 which support the mirrored troughs 90 as well as the steel grid 3-4 and the echelon lenses 90a by means of struts 96. The feed lines 96d and the insulated return lines 96e for the cooling water circuit run within the floating bodies 95.

Figure 10:
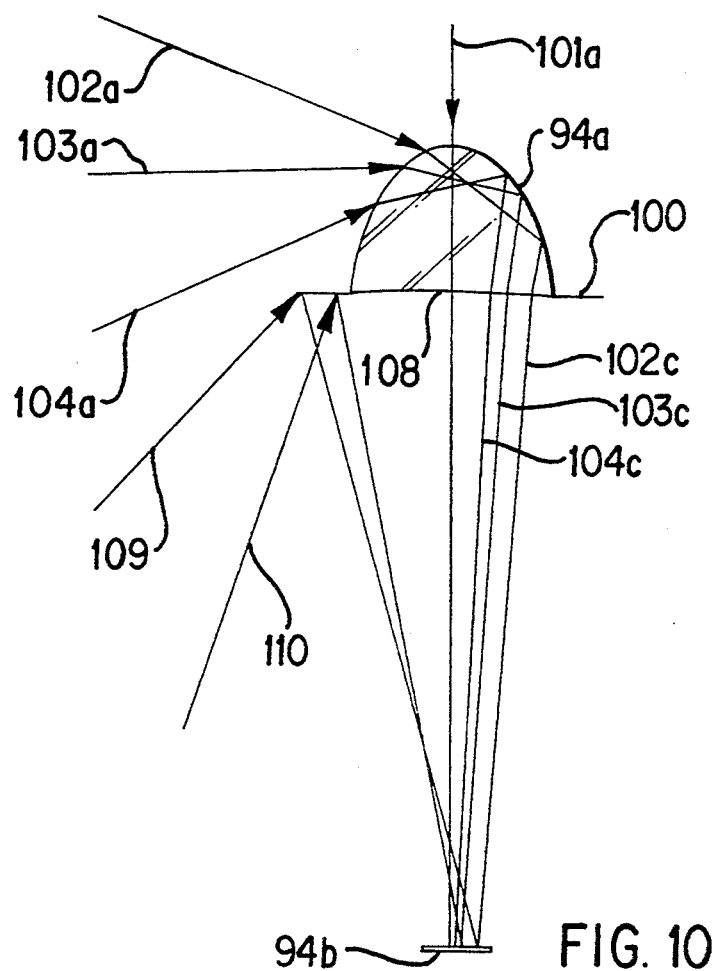
FIG. 10 is an enlarged view of the ray path through a cylindrical lens in FIG. 9.

FIG. 10 shows the path of rays through the optical deflecting element 94a, the upper rim of which approximately follows a sine function while the underside has a slightly concave configuration. Along this optical deflecting element 94a reflectors 100 are arranged which deflect the reflected rays 109 and 110 also onto the photovoltaic cell 94b. Solar rays 101 running perpendicular within the projection penetrate the optical deflecting element 94a without refraction and impinge as ray 101a onto the photovoltaic cell 94b. Rays 102a, 103a and 104a coming from the side experience a refraction upon entering and a total reflection on the opposite side of the optical deflecting element 94a. These reflected rays 102b, 103b and 104b will be refracted away from the normal on the underside 108 to such an extent that the emerging rays 102c, 103c and 104c will be equally distributed as they impinge on the photovoltaic cell 94b. Rays 109 and 110 will be aimed by the reflectors 100 directly onto the photovoltaic cell 94b.

Figure 11A:
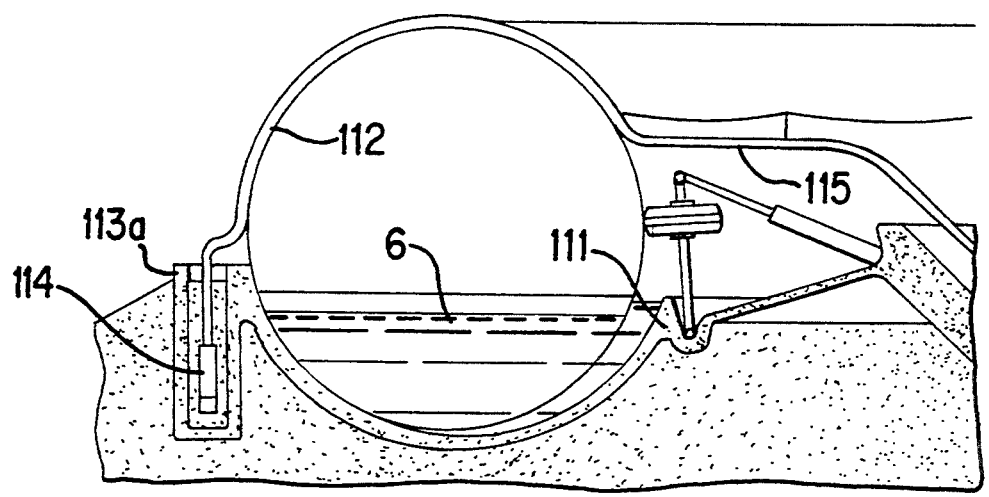
FIG. 11a shows a rim portion of a platform with trough supplying the cooling water.

The annular frame shown in FIG. 11 a contains the structural elements already described in FIG. 2.

Figure 11B:
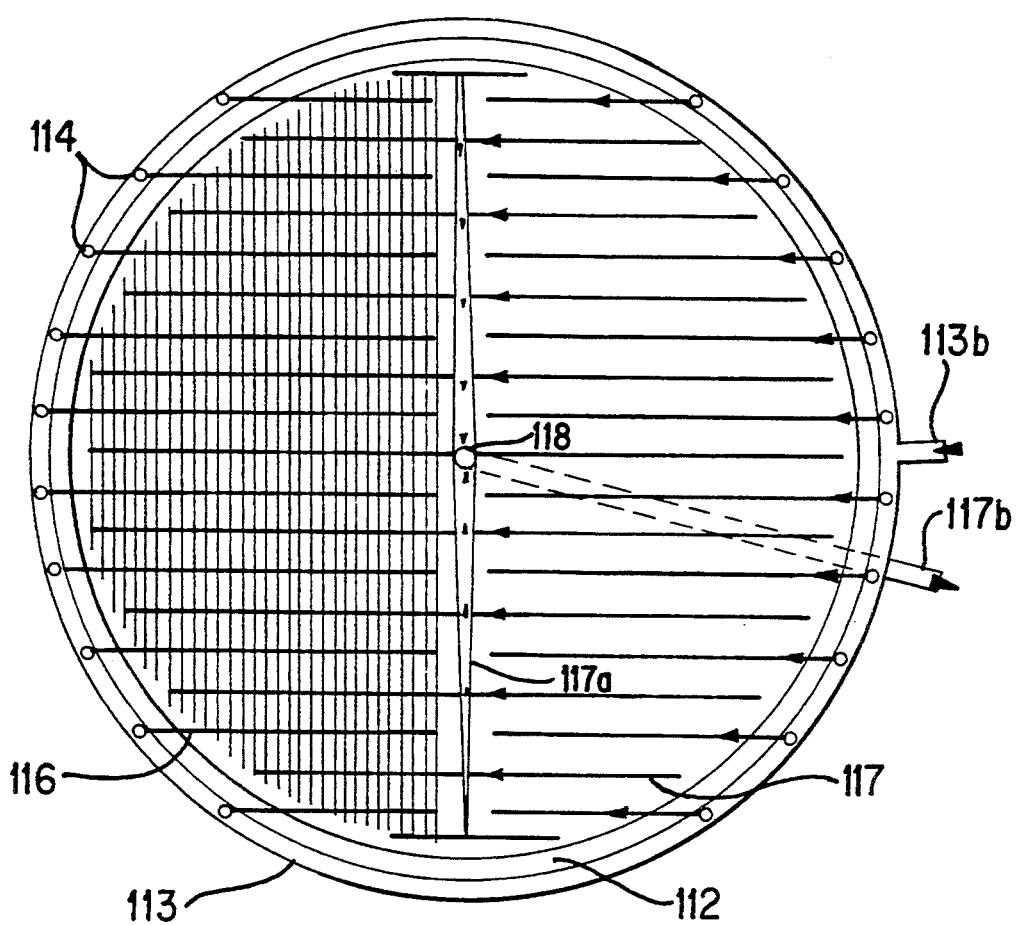
FIG. 11b illustrates the arrangement of tubes supplying and draining the cooling water inside the platform.

In addition, a small annular channel 113a is located around the periphery of trough 111 which is continuously filled with cooling water by the pipe 113b (FIG. 11b). Submersible pumps 114 projecting into said annular channel 113 convey the water via conduits 115 into a distribution system 116 (see FIG. 11b). These pipes supply the cooling pipes of the photovoltaic cells with cooling water as described in FIG. 4.

After the cooling water has reached its maximum temperature it flows through pipes 117, which are connected to collecting pipe 117a, the cross section of which enlarges from the periphery of the platform to the center.

By means of a revolving turret 118 in the center of the platform the heated water can be transported via pipe 117b to a heat utilizing system such as a desalination plant or a thermodynamic prime mover (not shown). If the heat is to be used in a thermal cyclic process two branched water distribution systems are necessary because the temperature of the water returning from the heat utilization such as a thermodynamic prime mover is too great for the open channel.

Figure 12:
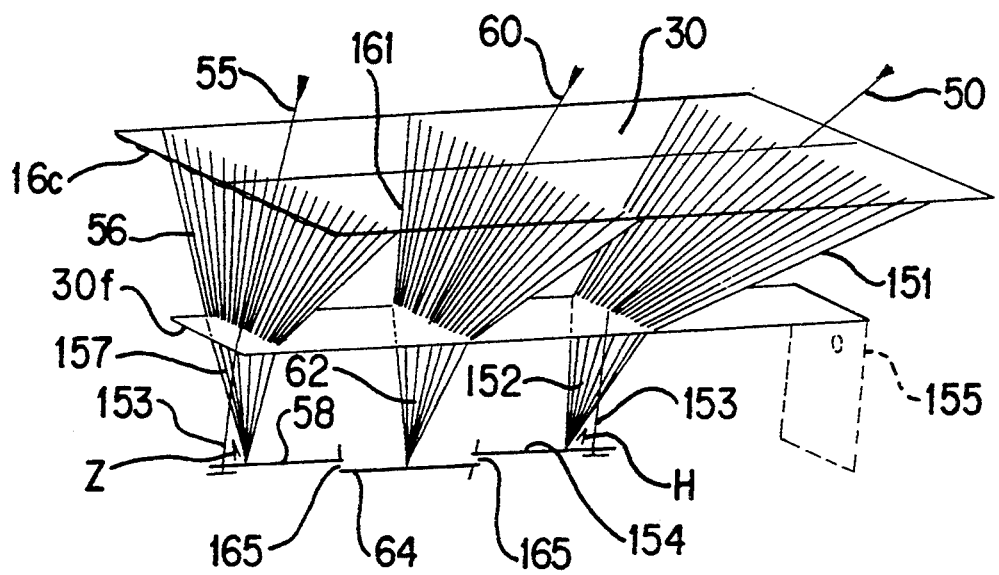
FIG. 12 shows the wedges of rays with different angles of incidence passing through the roof element and the echelon lenses.

The wedge of rays created by the fresnel lens 16c in FIG. 12 will be refracted by an echelon lens 30f. During the morning and late afternoon hours the sun rays 50 close to the horizon produce a wedge of rays 151. This will be refracted by the echelon lens 30f into wedge of rays 152 which form steep positive angles with the normal on the focal line 154. At high noon the almost vertical rays 55e form a wedge of rays 56 which by penetrating the echelon lens 30f will be refracted into wedge of rays 157. This forms the same measure of angle with the normal 153 but with the opposite sign as wedge of rays 152. Once in the morning and once in the afternoon the rays impinge in the direction of arrow 60 which is refracted into wedge of rays 161. In penetrating the echelon lens 30f this wedge of rays 161 experiences a refraction which results in wedge of rays 62. The focal line 64 belonging to wedge of rays 62 is located by a vertical distance 165 below the focal line 154 of low angles of incidence and of the focal line 58 of the noon radiation.

Figure 13:
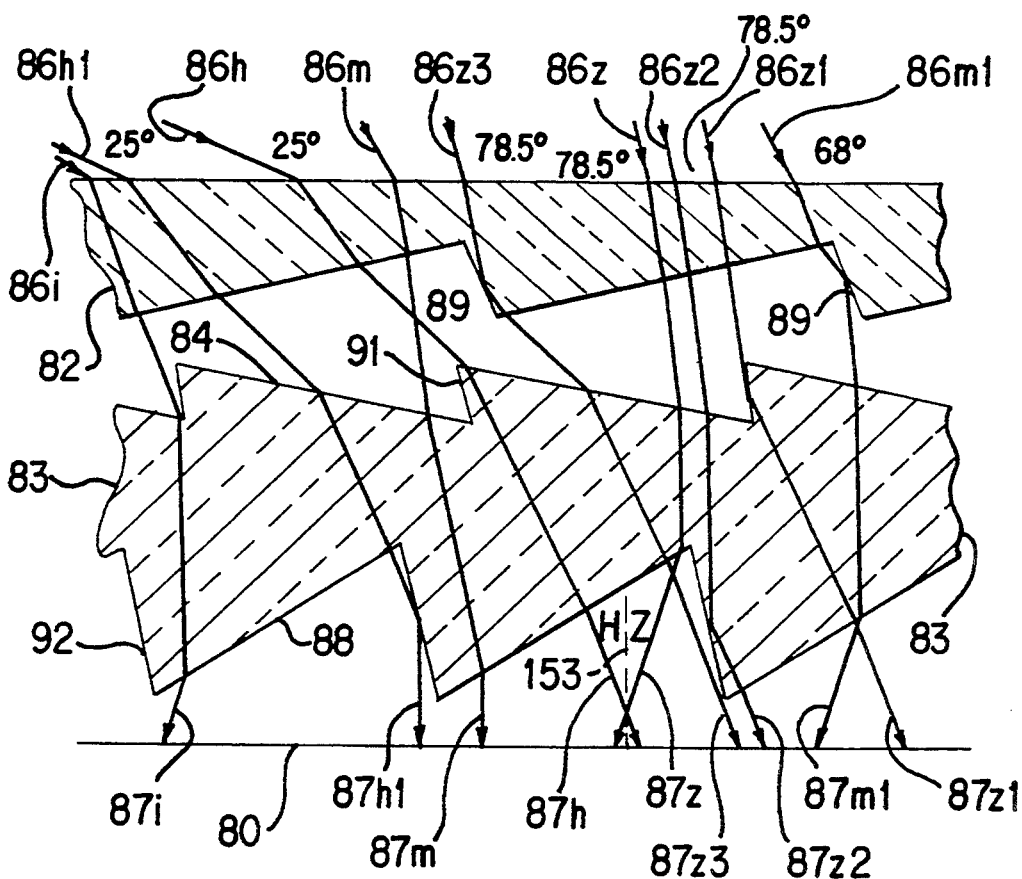
FIG. 13 shows the ray path through an optical system of two panes.
Figure 14:
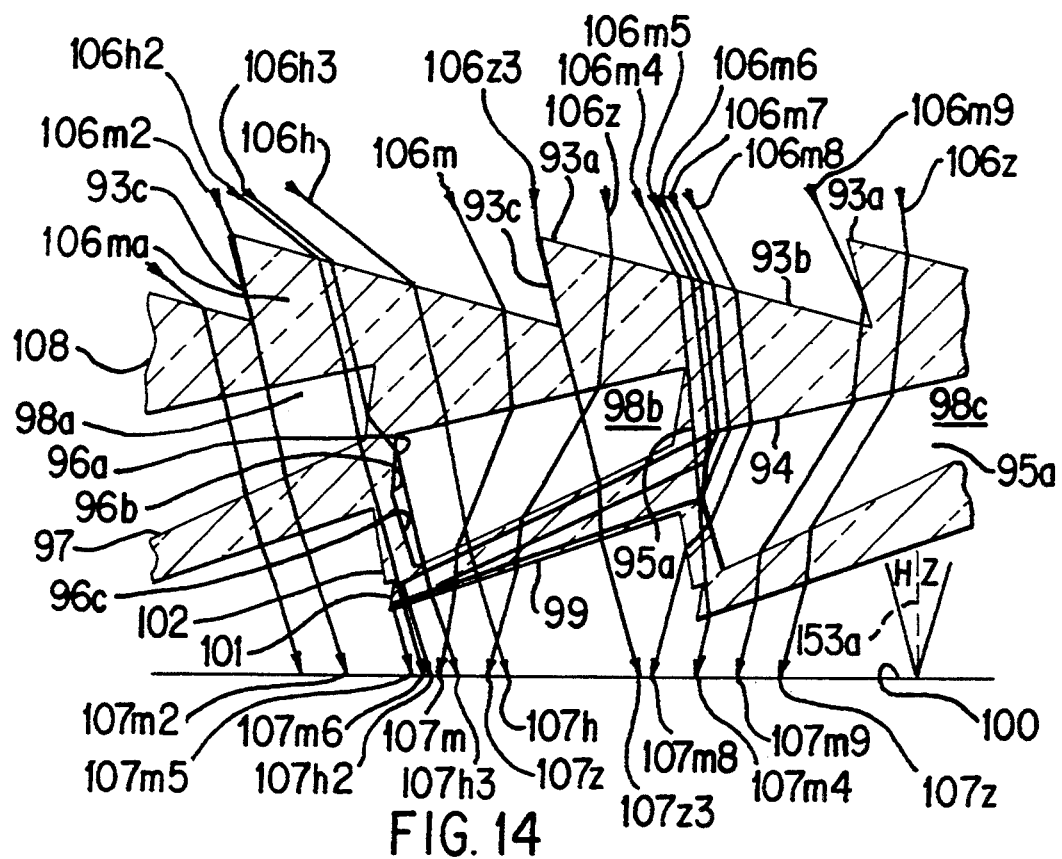
FIG. 14 shows the ray path through a wedged panel containing prism forming channels.

FIGS. 13 and 14 show examples of the principle of echelon lens systems 30f with which sun rays impinging at different angles will be directed onto the energy converter close to the normal within a limited range of angles. There are no exact data given for the angular ratio because this can readily be calculated dependent on the geographic latitude and the desired profile of output during the day.

The cross section of an echelon lens shown in FIG. 13 consists of two cylindrical echelon lenses 82 and 83. All flanks 89, 91 and 92 which are not penetrated by the sun rays are facing the sun. The morning and afternoon ray 86m impinges on the energy converter 80 as exit my 87m after being refracted four times. Ray 86h entering close to the horizon exits as ray 87h after being refracted four times and forms an angle H with the normal 153 on the energy converter 80. A ray 86z close to the zenith exits as ray 87z after being refracted four times and forms an angle Z with the normal 153. If the morning or afternoon ray 86ml impinges on the flank 89 it experiences a reflection on this flank 89 resulting in a small change in the angles of the remaining path of the ray. After being refracted four times ray 87m1 exits at an angle with the normal 153 which lies within the limiting angle interval H-Z. The same applies to ray 86z1 entering close to the zenith which after being refracted three times experiences a total reflection on flank 91 and exits the echelon lens 83 as ray 87z1 almost parallel to ray 87h. If ray 86z2 is reflected on flank 92 after being refracted three times the ray will be totally reflected and will exit as ray 87z2 whereby it also runs within the permitted angular interval H-Z. Because of the angle which flank 89 forms with the vertical, ray 86z3 also experiences a total reflection which results in exit ray 87z3 which also runs within the maximum permitted angular interval H-Z. If ray 86h1 originating close to the horizon impacts one of the flanks 89, 91 or 92 the major part of it will be reflected and typically as ray 86hl directed to the energy converter 80 impinging within the permitted angular interval H-Z. The course of ray 86i impinges at an angle between the ray close to the horizon 86h and the ray at noon 86m results in an exit ray 87i, which leaves the echelon lens also within the permitted angular interval H-Z.

FIG. 14 shows the principle of the design of an echelon lens in cross section in which two layers are combined to form an extrudable channeled panel with prismatic channels 98a, 98b and 98c. Such echelon lenses which are designed as channeled panels require special optical geometries to optimize efficiency. Considering the rays of the morning and afternoon radiation, which is especially important in view of the energy gain, it can be proven that geometries are possible which let pass through all sun's rays associated with the angle of incidence interval for these hours no matter at which point of the surface they impinge.

The entrance area is divided into sections 93a, 93b and the flank 93c. The exit surface 94 facing channel 98c is bordered by flank 95a and the wall portions 96b, 96c, 96d and 96e. The second entrance area 97 defines, together with the exit surface 94, flank 95a and the wall portions 96a, 96b and 96c, a channel 98a of prismatic cross section. The second exit surface 99 is defined by flank 102 and an area with total reflection 101. Ray 106h impinging with a low angle of incidence exits the echelon lens under an angle H to the normal 153a on the energy converter 100 as ray 107h after being refracted four times. The high noon ray 106z enters channel 98c from exit surface 94 and experiences a further refraction in passing through the prism between the two entrance surfaces 97 and the second exit plane 99. From there it exits as ray 107 at an angle Z with the normal. All other rays exit within the range of angles H and Z. Besides the rays 106h and 106z, ray 106m also penetrates the two prism layers. After entering the second prism layer ray 106h2 passes planes 97 and 99 of the lower prism and exits the second prism layer as ray 107h2 at the same angle as ray 107h. The same is true for ray 106h3 from close to the horizon which passes from channel 98a through the parallel surfaces 95a and 96b into channel 98b and from there follows the path of ray 106h. Ray 106m2 enters area 93a whereby it is reflected into ray 106ma which runs parallel to ray 106h with a low angle of incidence which has been refracted once. Thus ray 106ma exits as ray 107m2 parallel to ray 107h. Ray 106z3 entering close to the zenith in area 93a experiences a total reflection on flank 93c and follows the path of ray 106h.

The morning and afternoon ray 106m4 will be refracted only twice and leaves the second exit plane 99 as ray 107m4. Rays 106m5 and 106m6 exit surface 94 and enter into channel 98c and exit the second exit surface 99 after a total reflection in the total reflection area 101 as rays 107m5 and 107m6. Ray 106m8 experiences a refraction to the left in penetrating prismatic channel 98c and exits flank 102 as ray 107m8 parallel to ray 107z which has the maximum permitted angle. The noon ray 106z3 has a total reflection on flank 93c and then follows ray 106h which originated close to the horizon.

Figure 15:
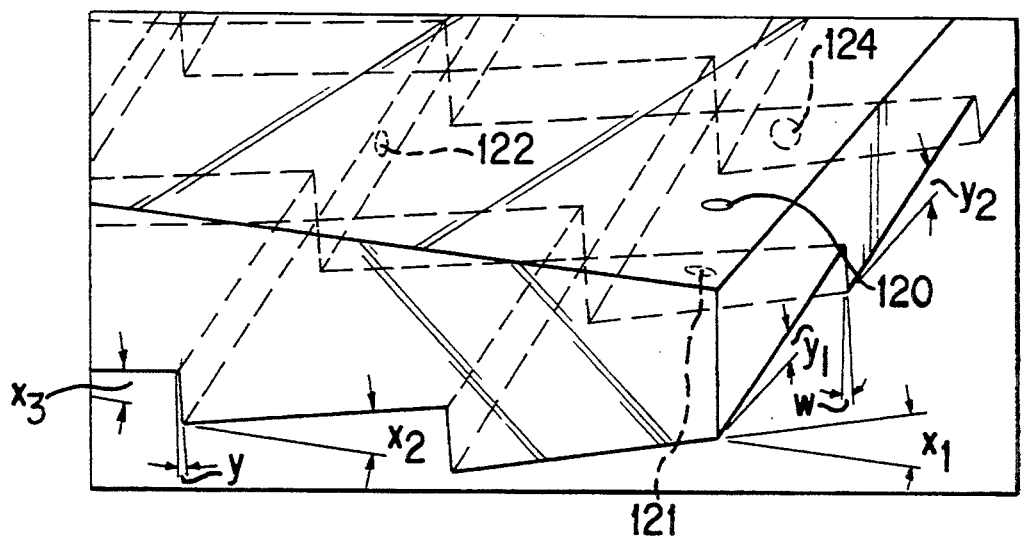
FIG. 15 is a section of a roof element which guides the sun's rays on a focal line.

FIG. 15 shows an echelon lens serving as roof element which performs the function of the fresnel lens and of the echelon lens which refract the wedge of rays towards the vertical. The smooth surface of the roof element 120 forms the entrance surface. In the planes running perpendicular to the sun's rays rectangular facets form the angles $x_1, x_2, x_3, \ldots$, with the horizontal which become zero in the focal area. The planes facing the energy converter of the rectangular facets 121 are at the same time inclined by a constant angle y in the plane pointing to the sun. This results in a wedge of rays which are in addition refracted towards the vertical. As is also the case in conventional fresnel lenses the flanks 122 form with the normal on the plane upper surface 120 an angle v which also decreases towards the focal area. The flanks 124 running vertical thereto enclose an angle w with the vertical, which coincides with the path of the morning and afternoon rays within the roof element after entering through surface 120.

FIG. 16 shows the arrangement of a photovoltaic cell relatively to the wedge of rays shown in FIG. 12 in which the focal line 64 of a perpendicular impinging wedge of rays 62—shown in FIG. 12—would run at a distance below the energy converter. The focal line 58 which belongs to the wedge of rays 152 or 157 of the rays impinging under the lowest permitted angle of incidence runs almost at the same distance above the energy converter 160 as the focal line 64 would run below it. This ensures that the energy converter 160 is exposed almost in its entire width to the concentrated radiation.

FIG. 17 shows an arrangement in which a rod shaped diverging lens 125 spreads the vertical impinging wedge of rays 62 into parallel rays 126 while the focal line 58 of the wedge of solar rays 152 and 157 impinging within the acceptable angular interval coincides with the axis of the rod shaped diverging lens 125. Thus the sun's rays experience no noticeable deflection and impinge onto the full width of energy converter 170.

FIG. 18 shows an arrangement in which the energy converting device is placed above the theoretical position of the focal line 184 of the vertically impinging wedge of rays 62. Above the geometrical position of focal line 185 belonging to the wedges of rays 152 and 157 impinging under the largest acceptable angle a convex cylindrical lens 181 is arranged whereby the focal line 185 of the partial wedge of rays 62a lies only slightly above the energy converter 180. The solar rays 152 and 157 impinging under the smallest or largest allowed angles of incidence create a focal line 188 which lies almost centrally between the energy converting device 180 and the convex cylindrical lens 181. The width of the convex cylindrical lens 181 is determined by the width of the wedges of rays 152 and 157.

Figure 19:
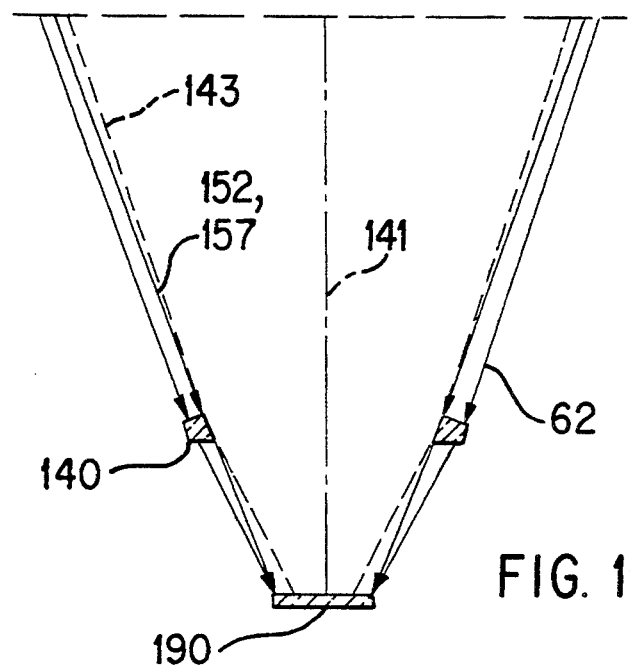
FIG. 19 shows the arrangement of the energy converters relative to two focal lines with interposed prismatic strips.

FIG. 19 shows an arrangement to compensate for the different paths of rays in the course of the day in which the energy converting device is impacted on its entire width by the wedges of rays 152 and 157 impinging under the largest allowable angles of incidence. Only the inner part 143 of the internal rays 62 arriving vertically strike directly onto the energy converting device 190. The outer part of inner rays 62 which would miss the energy converter without auxiliary means will be refracted by the two prisms 140 towards the normal 141.

Figure 20:
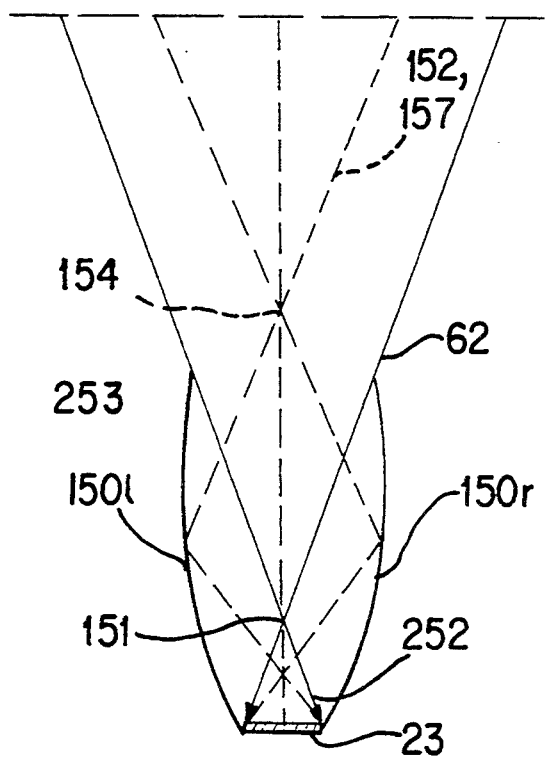
FIG. 20 shows the arrangement of the energy converter relative to two focal lines with interposed mirrored strips.

FIG. 20 shows an arrangement in which the energy converting device 23 is enclosed by two reflecting mirrored strips 150r and 150l, the curvature of which follows an elliptical shape. The distance between the energy converting device 23 and the echelon lenses is chosen such that the vertically impinging wedge of rays 62 generates a focal line 151 which runs at such a distance above the energy converting device 23 that the width of the diverging rays 252 corresponds with the width of the energy converter 23 and that the diverging rays 253 below the focal line 154 of the wedges of rays 152 and 157′ generated by rays impinging with the largest permitted angular range will be reflected onto the energy converting device 23.

We claim:

1. A system for focusing the sun's rays onto one or more energy converters comprising:
   a platform floating on a layer of water (9) having a horizontally aligned roof covering said platform, comprising a set of transparent echelon lenses (16, 30u, 40b, 82, 83, 89c, 90a) and one or more energy converters (23, 53, 73, 73′, 94b) positioned in at least one line below said roof,
   each of said echelon lenses comprising prism shaped steps (84) having flanks (89, 91) adapted to face the sun and which run perpendicular to said lines of energy converters (53, 73, 73′, 94b);
   each of said echelon lenses having a geometry which refracts wedges of the sun's rays (86) downwards within a limited range of angles (87h-87z) around a vertical line (153), said range of angles including zero degrees, and in addition, means (16c, 90, 121) are provided which concentrate the downward refracted sun's rays onto said lines of energy converters.

2. A system according to claim 1, wherein each of said echelon lenses comprises:
   a smooth upward facing surface (120);
   a lower surface comprising a plurality of facets (121) each having a first flank (124) and second flank (122),
   said first flank (124) adapted to face the sun and said second flank (122) running perpendicular to said first flank; and,
   each facet (121) further comprising a facet surface facing an energy converter (53, 73, 73′),
   said facet surface being tilted around two axes which run perpendicular to each other in order that solar rays will be refracted as in a concentrating linear fresnel lens onto a focal line and that resulting wedges of rays (62, 152, 157) are refracted downwards within a range of angles (87h, 87z), which range of angles includes zero degrees.

3. A system according to claim 1, wherein said horizontally aligned roof further comprises portions (40b, 30u, 89c) which are sloped downwards, thereby facilitating the draining of rainwater.

4. A system according to claim 1, characterized in that the rays from the sun (86h) when the sun is close to the horizon undergo a refraction downwards by the echelon lens (30f, 120, 124), and that the emerging rays (87h) form an angle H with a vertical plane (153), and that the emerging rays (87z) of rays from the sun (86z) when the sun is close to its zenith, form an angle Z on the opposite side of the vertical plane (153) with this plane.

5. A system according to claim 1, which further comprises an echelon lens (83) arranged below said first echelon lens (82), said first echelon lens (82) facing outwards, said second echelon lens (83) comprising a plurality of prism shaped steps (84, 88) of different shape to the prism shaped steps of first echelon lens (82) and running parallel to said prism shaped steps of said first echelon lens (82).

6. A system according to claim 5, wherein each of said second echelon lenses (83) further comprises:
   an upper and lower side; and wherein said prism shaped steps (84, 88) are distributed on both of said sides.

7. A system for focusing the sun's rays onto one or more energy converters, comprising:
   a) a first echelon lens (82) having an upper side and a lower side, said lower side facing one or more energy converters (23, 53, 73, 73', 80, 94b) and having prism like steps adapted to be at right angles to the sun's rays, the flanks (89) of said steps adapted to face towards the sun,
   b) an adjacent second echelon lens (83) arranged parallel to the first echelon lens (82), said second echelon lens (83) having an upper side and a lower side, each of said sides of said second echelon lens having steps (84, 88), the upper side facing the lower side of the first echelon lens (82), the steps (84) of the upper side running parallel to the steps of the first echelon lens (82), and also having flanks (91, 92) adapted to face the sun, the optical interfaces of the first and second echelon lenses enclosing a prismatic intermediate space tapering towards the sun,
   c) the lower side of the second echelon lens (83) facing one or more energy converters (23, 53, 73, 73', 80, 94b) and having steps (88) whose interfaces are inclined so that they cooperate with the correspondingly inclined interfaces of the other steps such that whether the sun's rays impinge on the upper side of said first echelon lens with a small angle of incidence (86h) or at an angle (86z) close to the normal, the rays are refracted by said first and second echelon lenses, and partly reflected on the flanks (89) so that they impinge as wedges on the one or more energy converters (23, 53, 73, 73', 80, 94b) within a limited range of angles about the normal (153).

8. A system according to claim 7, characterized in that the rays from the sun (86h) when the sun is close to the horizon undergo a refraction downwards and that the emerging rays (87h) form an angle H with the vertical plane (153), its measure being identical with the angle Z which is formed between the vertical plane (153) and the emerging rays (87z) of rays (86z) from the sun when the sun is close to its zenith.

9. A system according to claim 7, which contains a flat lens in which the sun's rays are adapted to pass through a plurality of interfaces (121) of prisms whose flanks (122) are at right angles to the flanks (124), the interfaces being arranged symmetrically with respect to the vertical plane in which the energy converters lie and forming, with the horizontal plane, angles X1, X2, X3 whose angular magnitude increases with increasing distance from the axis of symmetry, which forms the line of intersection between said vertical plane and the horizontal plane.

10. A system according to claim 7, having in addition a concentrator device, comprising mirrored troughs (90).

11. A system according to claim 7 or 10 with a rod-shaped compound deflection element (94a, 100) which guides the rays (102a, 103a, 104a) impinging over almost 180 degrees, by refraction and internal total reflection towards the energy converter (94b).

12. A system according to claim 1 or claim 7, wherein each of said energy converters is adjustably positioned to capture a vertical movement of focal lines (58, 64, 154) caused by different angles of incidence of the sun's rays (50, 55, 60).

13. A system according to claim 1 or claim 7, wherein the echelon lens further comprises:
   a hydrophilic coating layer on a surface of said lens, said surface facing the one or more energy converters (23, 53, 73, 73').

14. A system according to claim 1 or claim 7, which further comprises:
   sensors (58a, 58b, 78a', 78b') arranged along first and second sides of said one or more energy converters (23, 53, 73, 73') outside of the wedges of rays (10b'),
   said sensors causing an adjusting movement of its associated energy converter (23, 53, 73, 73') relative to said echelon lens when said sensors are exposed to stray rays (10c', 10c") of a wedge of rays which has shifted relative to its energy converter (23, 53, 73, 73').

15. A system according to claim 5 or claim 7, wherein a first and a second echelon lens form an integral unit which comprises:
   a plurality of internal channels (98a, 98b, 98c) having first walls (94) and second walls (97), said walls and an adjacent transparent layer (108) forming prisms.

16. A system according to claim 1 or claim 7, characterized in that the flanks (89, 91) which are adapted to face the sun reflect a part of the solar rays (86i, 86m1).

17. A system according to claim 15, characterized in that the flanks which are facing the sun (89, 91, 92) form such an angle with the vertical that sun rays (86z1, 86m1, 86i, 86z2) impinging on these flanks are reflected in such a way that they emerge within the same permitted angular interval (H-Z) as sun rays which penetrate between the flanks.

18. A system according to claim 1, which further comprises:
   a plurality of mirroring strips (150l, 150r) each having upper and lower edges, said lower edges running along edges of said energy converters (23) and
   said upper edges having a greater distance from each other than the width of said energy converter (23).

19. A system according to claim 1, wherein each of said energy converters (170, 180, 190) comprises a photovoltaic cell; and, which further comprises a rod-shaped optical element (125, 140, 181) which bends the sun's rays towards the energy converter (170, 180, 190).

20. A system according to claim 19, which further comprises:
   a diverging cylindrical lens (125) located above an energy converter (170) through which wedges of rays pass.

21. A system according to claim 5, characterized in that the first echelon lens (82) and the second echelon lens (83) are offset relatively to each other in the horizontal direction.

22. A system according to claim 4, characterized in that the energy converting devices (23, 53, 73, 73', 160, 180) are positioned midway between the focal line (64) of the vertically running wedges of rays (62) and the focal lines (58, 164) of the inclined running wedges of rays (152, 157).

23. A system according to claim 1, characterized by a layer of water (9) which is totally covered by a film (80b), which film supports the transparent roof elements (89c).

24. A system according to claim 1, characterized in that the energy converting device is in good heat conducting contact with the water of water layer (9) and that the water absorbs the waste heat of the energy converters during sun shine hours.

* * * * *